(12) United States Patent
Tabata et al.

(10) Patent No.: US 7,880,539 B2
(45) Date of Patent: Feb. 1, 2011

(54) POWER AMPLIFIER AND LIQUID JET PRINTING APPARATUS

(75) Inventors: Kunio Tabata, Shiojiri (JP); Atsushi Oshima, Shiojiri (JP); Noritaka Ide, Shiojiri (JP); Shinichi Miyazaki, Suwa (JP); Hiroyuki Yoshino, Matsumoto (JP); Nobuaki Azami, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/615,744

(22) Filed: Nov. 10, 2009

(65) Prior Publication Data

US 2010/0117732 A1 May 13, 2010

(30) Foreign Application Priority Data

Nov. 11, 2008 (JP) .............................. 2008-288532

(51) Int. Cl.
*H03F 3/38* (2006.01)
(52) U.S. Cl. .............................. 330/10; 330/302; 347/5; 347/10
(58) Field of Classification Search .................. 330/10, 330/302; 347/5, 10
See application file for complete search history.

(56) References Cited

U.S. PATENT DOCUMENTS

| | | | |
|---|---|---|---|
| 6,733,117 B2 * | 5/2004 | Tajima et al. | 347/87 |
| 6,929,340 B2 * | 8/2005 | Ishizaki | 347/5 |
| 7,239,200 B2 * | 7/2007 | Ishii et al. | 330/10 |
| 7,244,007 B2 * | 7/2007 | Ishizaki | 347/5 |
| 2003/0053243 A1 * | 3/2003 | Kubota et al. | 360/75 |

FOREIGN PATENT DOCUMENTS

| | | |
|---|---|---|
| JP | 2005-329710 | 12/2005 |
| JP | 2007-168172 | 7/2007 |
| WO | 2007/083669 A1 | 7/2007 |

* cited by examiner

*Primary Examiner*—Patricia Nguyen
(74) *Attorney, Agent, or Firm*—Workman Nydegger (57) ABSTRACT

A power amplifier includes: a modulator pulse-modulating a drive waveform signal serving as a reference of a drive signal applied to actuators and outputting a modulated signal; a digital power amplifier amplifying the power of the modulated signal and outputting an amplified digital signal; a low pass filter smoothing the amplified digital signal and outputting the drive signal; and an inverse filter circuit being disposed at a front stage of the modulator and capable of obtaining a desired waveform precision of the drive signal even when a frequency characteristic of a filter including the low pass filter and an electrostatic capacitor of the actuators varies depending on the number of driven actuators, wherein the inverse filter circuits include a plurality of inverse filters connected in series.

8 Claims, 10 Drawing Sheets

POWER AMPLIFIER AND LIQUID JET PRINTING APPARATUS

This application claims priority to Japanese Patent Application No. 2008-288532 filed on Nov. 11, 2008, and the entire disclosure thereof is incorporated herein by reference.

BACKGROUND

1. Technical Field

The present invention relates to a power amplifier pulse-modulating a drive waveform signal serving as a reference of a drive signal for driving an actuator, amplifying the power of the modulated signal, and outputting the amplified modulated signal as a drive signal.

2. Related Art

In comparison with an analog power amplifier linearly driving a pair of transistors connected in a push-pull manner, a digital power amplifier amplifying the power by switching, that is, digitally operating, switching elements connected in a push-pull manner has excellent efficiency and has been widely used.

When a drive signal is output to an actuator for ejecting a liquid from nozzles of a liquid jet printing apparatus using the digital power amplifier, a drive waveform signal serving as a reference of the drive signal is pulse-modulated into a modulated signal by the use of a modulation unit, the power of the modulated signal is amplified by the use of the digital power amplifier, an amplified digital signal is smoothed by the use of a low pass filter, and the resultant digital signal is output as the drive signal. The low pass filter reduces the frequency component of pulse modulation.

At this time, when the number of driven actuators varies, the frequency characteristic of a filter including the low pass filter and electrostatic capacitors of the actuators also varies, whereby the desired waveform precision of the drive signal cannot be obtained.

Therefore, as described in PCT publication No. WO2007/083669, the applicant of the invention provided a front stage of the modulation unit with an inverse filter capable of providing the desired waveform precision of the drive signal regardless of the number of driven actuators.

However, since the low pass filter actually used in the digital power amplifier is a high-order filter of a third order or higher, a low-order inverse filter of a first or second order may not provide the desired waveform precision of the drive signal.

On the contrary, when a high-order filter of a third order or higher is used as the inverse filter, there is a problem that the configuration becomes complicated.

SUMMARY

An advantage of some aspects of the invention is that it provides a power amplifier capable of obtaining a desired waveform precision of a drive signal with a simple configuration.

According to an aspect of the invention, a power amplifier includes: a modulator pulse-modulating a drive waveform signal serving as a reference of a drive signal applied to actuators and outputting a modulated signal; a digital power amplifier amplifying the power of the modulated signal and outputting an amplified digital signal; a low pass filter smoothing the amplified digital signal and outputting the drive signal; and an inverse filter circuit being disposed at a front stage of the modulator and capable of setting a frequency characteristic of a filter including the low pass filter and an electrostatic capacitor of the actuators to a predetermined frequency regardless of the number of driven actuators. Here, the inverse filter circuits include a plurality of inverse filters connected in series.

According to this configuration, the filter constants of the plurality of inverse filters can be independently set. Combining these inverse filters makes it possible to obtain the desired waveform precision of the drive signal even when the frequency characteristic of the filter including the low pass filter and the electrostatic capacitor of the actuators varies depending on the number of driven actuators. Since the inverse filters are formed of low-order filters, it is possible to simplify the configuration.

In the power amplifier of the aspect of the invention, the plurality of inverse filters include a high frequency emphasis filter, a high frequency de-emphasis filter, and a selector selecting either the high frequency emphasis filter or the high frequency de-emphasis filter.

According to this configuration, either the high frequency emphasis filter or the high frequency de-emphasis filter is selected according to the number of driven actuators, thus making it possible to cope with an increase or a decrease in the number of driven actuators to obtain the desired waveform precision of the drive signal.

In the power amplifier of the aspect of the invention, the high frequency emphasis filter and the high frequency de-emphasis filter are first-order filters.

According to this configuration, it is possible to simplify the configuration.

In the power amplifier of the aspect of the invention, a filter constant of each of the inverse filters may be independently set.

According to this configuration, it is possible to finely adjust the drive signal output from the inverse filters on the basis of the number of driven actuators to obtain a high-precision waveform.

In the power amplifier of the aspect of the invention, the inverse filters may be set so that an output gain at a set frequency is 0 dB.

According to this configuration, independently setting the set frequency of the inverse filters enables a highly precise waveform of the drive signal.

In the power amplifier of the aspect of the invention, the set frequency of the inverse filter at the most downstream is the highest in the frequency band of the drive signal.

Such configuration enables a highly precise waveform of the drive signal.

In the power amplifier of the aspect of the invention, the set frequency for one of the inverse filters is set higher than that of another inverse filter located in the downstream.

According to this configuration, it is easy to set the filter constants of the inverse filters to obtain the waveform of the drive signal with high precision.

BRIEF DESCRIPTION OF THE DRAWINGS

The invention will be described with reference to the accompanying drawings, wherein like numbers reference like elements.

DESCRIPTION OF EXEMPLARY EMBODIMENTS

A power amplifier used in a liquid jet printing apparatus according to an embodiment of the invention will be described now.

Figure 1:
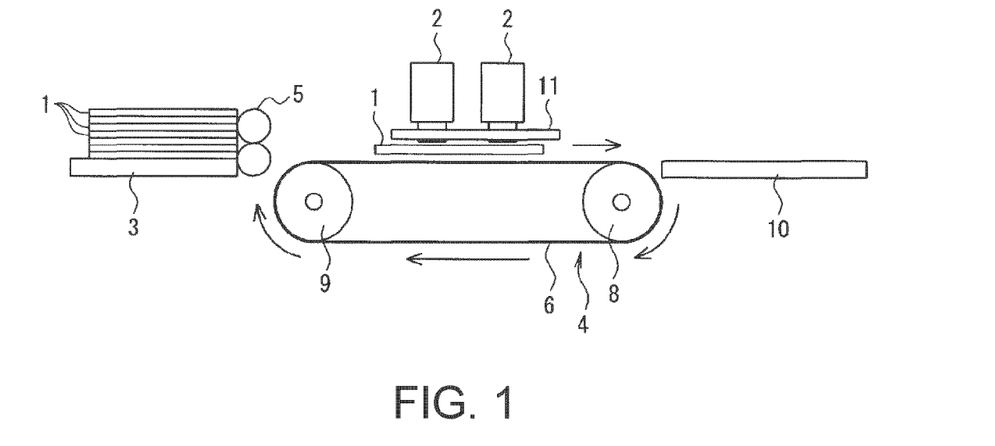
FIG. 1 is a front view schematically illustrating the configuration of a liquid jet printing apparatus employing a power amplifier according to an embodiment of the invention.

FIG. 1 is a diagram schematically illustrating the configuration of the liquid jet printing apparatus according to the embodiment of the invention. FIG. 1 shows a line-head printing apparatus in which a print medium 1 is conveyed in a direction of a left to right arrow and is subjected to a printing operation in a print area in the course of conveyance thereof.

In FIG. 1, reference numeral 2 represents plural liquid jet heads disposed above a conveyance line of the print medium 1. The liquid jet heads are arranged to form two lines in a print medium conveying direction and to extend in a direction intersecting the print medium conveying direction and are fixed to a head fixing plate 11.

Figure 2:
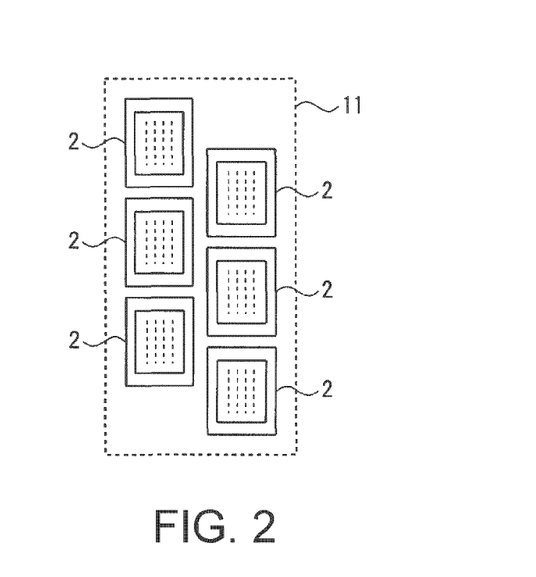
FIG. 2 is a plan view illustrating the vicinity of a liquid jet head used in the liquid jet printing apparatus shown in FIG. 1.

Plural nozzles are formed in the bottom surface of each liquid jet head 2 and this surface is called a nozzle plane. As shown in FIG. 2, the nozzles are arranged in a line shape in the direction intersecting the print medium conveying direction for each color of the liquid to be ejected, where the line is called a nozzle line and the line direction is called a nozzle line direction.

A line head covering the entire width in the direction intersecting the conveying direction of the print medium 1 is formed by the nozzle lines of all the liquid jet heads 2 arranged in the direction intersecting the print medium conveying direction. When the print medium 1 passes below the nozzle planes of the liquid jet heads 2, a liquid is ejected from plural nozzles formed in the nozzle plane to perform a printing operation.

The liquid jet heads 2 are supplied with four-color liquids of yellow (Y), magenta (M), cyan (C), and black (K) via liquid supply tubes from liquid tanks (not shown).

By simultaneously ejecting a predetermined amount of liquid from the nozzles formed in each liquid jet head 2 to a predetermined position, minute dots are formed on the print medium 1. By performing this operation for each color and once passing the print medium 1 conveyed by a conveying section 4, a one-pass printing operation can be carried out.

An electrostatic method, a piezoelectric method, or a film boiling liquid jet method can be employed as a method of ejecting a liquid from the nozzles of each liquid jet head 2. The piezoelectric method is employed in this embodiment. In the piezoelectric method, when a drive signal is applied to a piezoelectric device as an actuator, a vibration plate in a cavity is deformed to cause a variation in pressure in the cavity and a liquid is ejected from the nozzle due to the variation in pressure.

It is possible to adjust the amount of the ejected liquid by adjusting a wave height of a drive signal or a voltage varying slope. The invention may be similarly applied to liquid jet methods other than the piezoelectric method.

A conveying section 4 for conveying the print medium 1 in the conveying direction is disposed below the liquid jet heads 2. In the conveying section 4, a conveying belt 6 is suspended on a driving roller 8 and a driven roller 9 and an electric motor not shown is connected to the driving roller 8.

An adhesion unit (not shown) adhering the print medium 1 onto the surface of the conveying belt 6 is disposed inside the conveying belt 6. An air suction unit adhering the print medium 1 onto the conveying belt 6 using a negative pressure or an electrostatic adhesion unit adhering the print medium 1 onto the conveying belt 6 with an electrostatic force is used as the adhesion unit.

Accordingly, when a sheet of the print medium 1 is fed to the conveying belt 6 from a pickup section 3 by the use of a pickup roller 5 and the driving roller 8 is rotationally driven by an electric motor, the conveying belt 6 rotates in the print medium conveying direction, and the print medium 1 is adhered onto the conveying belt 6 by the adhesion unit and is conveyed.

A printing operation is performed by ejecting a liquid from the liquid jet heads 2 in the course of conveying the print medium 1. The print medium 1 having been subjected to the printing operation is discharged downstream to a sheet discharge section 10 in the conveying direction. A print reference signal output device including a linear encoder is disposed in the conveying belt 6.

The print reference signal output device monitors that the conveying belt 6 and the print medium 1 adhered to and conveyed by the conveying belt move in synchronization, outputs a pulse signal corresponding to the necessary print resolution with the movement of the conveying belt 6 after the print medium 1 passes through a predetermined position in a conveying path, and outputs a drive signal to the actuator 22 from a drive circuit to be described later on the basis of the pulse signal, whereby a predetermined color of liquid is ejected to a predetermined position on the print medium 1 and a predetermined image is drawn on the print medium 1 by the use of dots.

A control device controlling the liquid jet printing apparatus is disposed in the liquid jet printing apparatus according to this embodiment.

Figure 3:
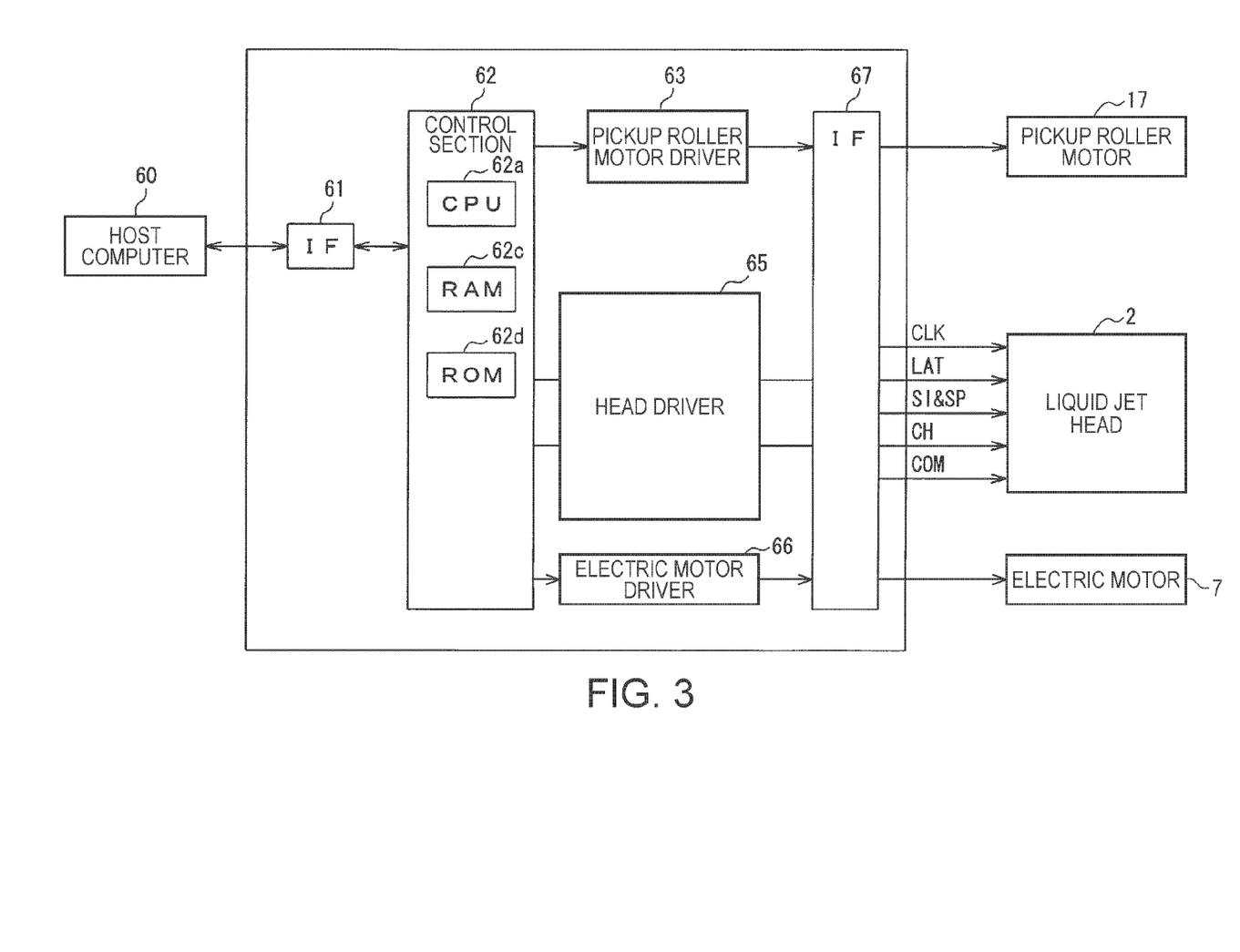
FIG. 3 is a block diagram illustrating a controller of the liquid jet printing apparatus shown in FIG. 1.

As shown in FIG. 3, the control device includes an input interface 61 reading print data input from a host computer 60, a control section 62 including a micro computer and performing a computing operation such as a printing process on the basis of the print data input from the input interface 61, a pickup roller motor driver 63 controlling the driving of a pickup roller motor 17 connected to a pickup roller 5, a head driver 65 controlling the driving of the liquid jet heads 2, an electric motor driver 66 controlling the driving of an electric motor 7 connected to the driving roller 8, and an interface 67 connecting the pickup roller motor driver 63, the head driver

65, and the electric motor driver 66 to the pickup roller motor 17, the liquid jet heads 2, and the electric motor 7.

The control section 62 includes a CPU (Central Processing Unit) 62a performing various processes such as a printing process, a RAM (Random Access Memory) 62c temporarily storing print data input via the input interface 61 and various data used to perform the printing process of the print data and the like or temporarily developing programs for the printing process and the like, and a ROM (Read-Only Memory) 62d formed of a nonvolatile semiconductor memory storing control programs executed by the CPU 62a.

When the control section 62 receives the print data (image data) from the host computer 60 via the input interface 61, the CPU 62a performs a predetermined process on the print data, calculates nozzle selection data (drive pulse selection data) such as data on what nozzle should eject a liquid or what amount of liquid should be ejected, and outputs a drive signal and a control signal to the pickup roller motor driver 63, the head driver 65, and the electric motor driver 66 on the basis of the print data, the drive pulse selection data, and input data from various sensors.

The pickup roller motor 17, the electric motor 7, and the actuators 22 in the liquid jet heads 2 operate by the drive signal and the control signal, and processes of picking up, conveying, and discharging the print medium 1 and the printing process of the print medium 1 are performed.

The elements of the control section 62 are electrically connected to each other via a bus (not shown).

Figure 4:
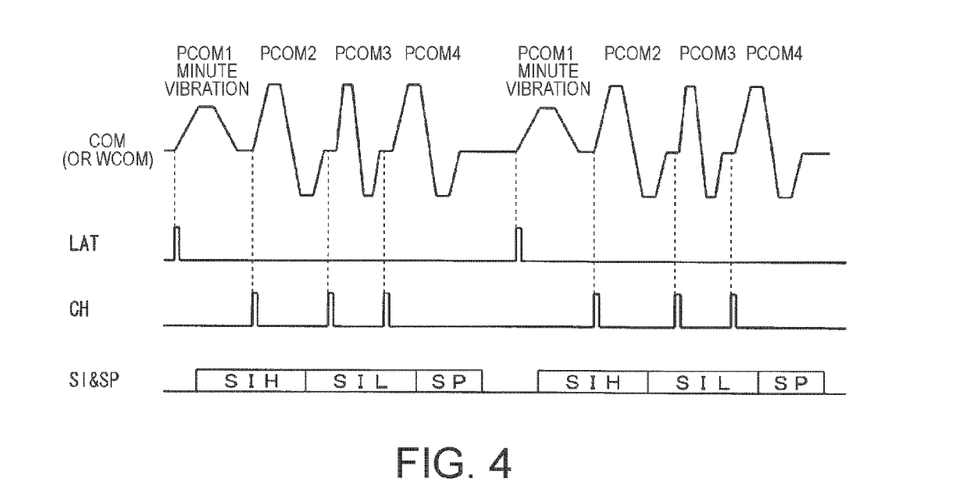
FIG. 4 is a diagram illustrating a drive signal used to drive actuators of liquid jet heads.

FIG. 4 shows an example of a drive signal COM which is supplied to the liquid jet heads 2 from the controller of the liquid jet printing apparatus according to this embodiment and used to drive the actuators 22 formed of piezoelectric devices.

In this embodiment, a signal of which the potential varies about a middle potential is used.

The drive signal COM is obtained by connecting drive pulses PCOM as unit drive signals for driving the actuators 22 to eject the liquid in time series. The rising edge of each drive pulse PCOM is a step where the volume of a cavity (pressure chamber) communicating with the nozzle is enlarged to draw in the liquid (it may be considered that a meniscus is drawn-in in consideration of the liquid ejecting plane), and the falling edge of the drive pulse PCOM is a step where the volume of the cavity is reduced to press out the liquid (it may be considered that a meniscus is pressed out in consideration of the liquid ejecting plane). By pressing out the liquid, the liquid is ejected from the nozzle.

By variously changing the voltage variation slope or the wave height of the drive pulse PCOM having such a voltage-based waveform, the amount of liquid drawn-in or the drawing-in speed and the amount of liquid pressed-out or the pressing-out speed can be changed. Accordingly, the amount of ejected liquid can be changed to obtain dots having different sizes.

Therefore, when plural drive pulses PCOM are connected in time series, it is possible to obtain dots having various sizes by selecting a single drive pulse PCOM therefrom and supplying the selected drive pulse to the actuator 22 to eject the liquid, or by selecting plural drive pulses PCOM and supplying the selected drive pulses to the actuator 22 to eject the liquid plural times.

That is, when plural liquid droplets land at the same position in a non-dried state, it is substantially the same as ejecting large liquid droplets, thereby enlarging the dots.

By combination of these techniques, it is possible to accomplish an increase in gray scale.

The drive pulse PCOM1 at the left end of FIG. 4 serves only to draw in the liquid but not to press out the liquid.

This is called minute vibration and is used to suppress or prevent the thickening of the nozzles without ejecting the liquid.

As the control signals from the controller shown in FIG. 3 in addition to the drive signal COM, the liquid jet head 2 is supplied with drive pulse selection data SI&SP for selecting the nozzles to eject the liquid on the basis of the print data and determining a connection time of the drive signal COM to the actuators 22 of the piezoelectric devices, a latch signal LAT and a channel signal CH for connecting the drive signal COM to the actuators 22 of the liquid jet heads 2 on the basis of the drive pulse selection data SI&SP after nozzle selection data are input into all the nozzles, and a clock signal CLK for transmitting the drive pulse selection data SI&SP as a serial signal to the liquid jet heads 2.

In the following description, the minimum unit of drive signals for driving the actuators 22 is referred to as drive pulse PCOM and the entire signal obtained by connecting the drive pulses PCOM in time series is referred to as drive signal COM.

That is, a series of drive signals COM is output as the latch signal LAT and the drive pulse PCOM is output as each channel signal CH.

Figure 5:
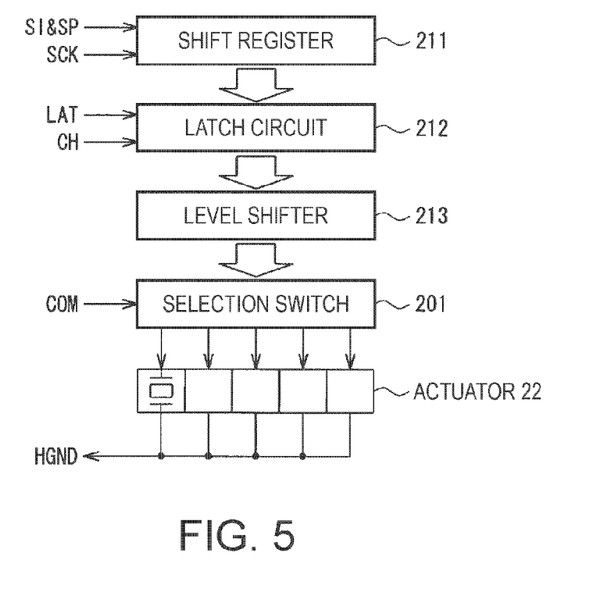
FIG. 5 is a block diagram illustrating the configuration of a switching controller.

FIG. 5 shows the specific configuration of a switching controller constructed in the liquid jet heads 2 so as to supply the drive signal COM (drive pulses PCOM) to the actuators 22.

The switching controller includes a shift register 211 storing the drive pulse selection data SI&SP for specifying the actuators 22 such as the piezoelectric devices corresponding to the nozzles to eject the liquid, a latch circuit 212 temporarily storing data of the shift register 211, and a level shifter 213 connecting the drive signal COM to the actuators 22 such as the piezoelectric devices by converting the level of the output of the latch circuit 212 and supplying the converted output to the selection switch 201.

The shift register 211 is sequentially supplied with the drive pulse selection data SI&SP and a memory area is shifted from the initial stage to the subsequent stage on the basis of the input pulse of the clock signal CLK.

The latch circuit 212 latches the output signals of the shift register 211 on the basis of the input latch signal LAT after the drive pulse selection data SI&SP corresponding to the number of nozzles is stored in the shift register 211.

The signals stored in the latch circuit 212 are converted into a voltage level which can turn on or off the selection switch 201 at the subsequent stage by the level shifter 213.

This is because the drive signal COM has a voltage higher than the output voltage of the latch circuit 212 and thus the dynamic voltage range of the selection switch 201 is set high.

Therefore, the actuators 22 such as the piezoelectric devices of which the selection switch 201 is turned off by the level shifter 213 are connected to the drive signals COM (drive pulses PCOM) at the connection time of the drive pulse selection data SI&SP.

After the drive pulse selection data SI&SP of the shift register 211 is stored in the latch circuit 212, next print information is input to the shift register 211 and the data stored in the latch circuit 212 is sequentially updated to correspond to the liquid ejecting time.

In the drawing, reference sign HGND represents a ground terminal of the actuators 22 such as the piezoelectric devices.

Even after the actuators 22 such as the piezoelectric devices are disconnected from the drive signal COM (drive pulses PCOM), the input voltage of the corresponding actuators 22 is maintained in the voltage just before the disconnection by the selection switch 201.

Figure 6:
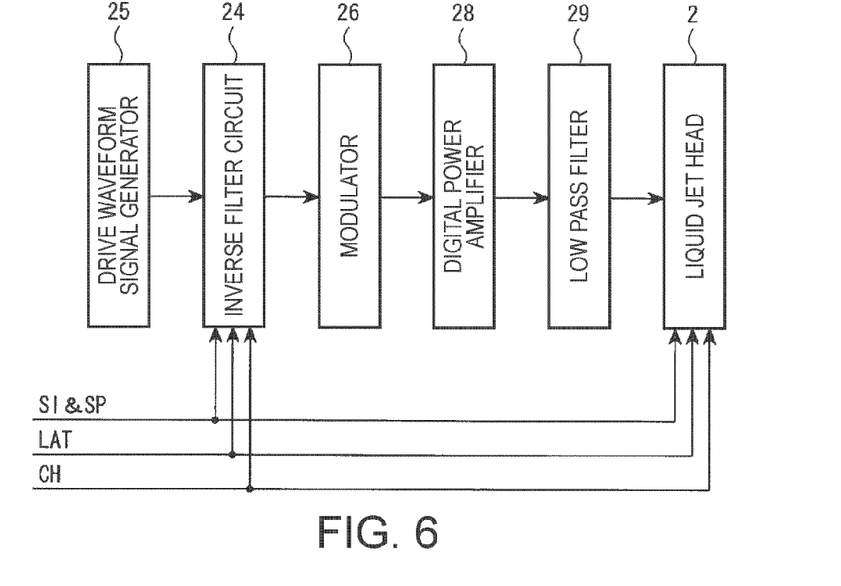
FIG. 6 is a block diagram illustrating an example of a drive circuit for an actuator.

FIG. 6 shows the schematic configuration of the drive circuit of the actuators 22.

The drive circuit of the actuators 22 is constructed by the control section 62 and the head driver 65 of the control circuit.

The drive circuit according to this embodiment includes a drive waveform signal generator 25 generating the source of the drive signal COM (drive pulses PCOM), that is, a drive waveform signal WCOM as a reference of a signal for controlling the driving of the actuators 22, on the basis of previously stored drive waveform data DWCOM, an inverse filter circuit 24 performing an inverse filtering process on the drive waveform signal WCOM generated by the drive waveform signal generator 25, a modulator 26 pulse-modulating the inversely-filtered drive waveform signal FWCOM having been subjected to the inverse filtering process by the inverse filter circuit 24, a digital power amplifier 28 amplifying the power of the modulated signal pulse-modulated by the modulator 26, and a low pass filter 29 smoothing the amplified digital signal of which the power has been amplified by the digital power amplifier 28 and supplying the smoothed amplified digital signal as the drive signal COM (drive pulses PCOM) to the actuators 22 from the selection switches 201.

The drive waveform signal generator 25 converts the drive waveform data DWCOM output from the CPU 62a into a voltage signal, holds the voltage signal for a predetermined sampling period, converts the voltage signal into an analog signal by a D/A converter, and outputs the analog signal as the drive waveform signal WCOM.

Figure 7:
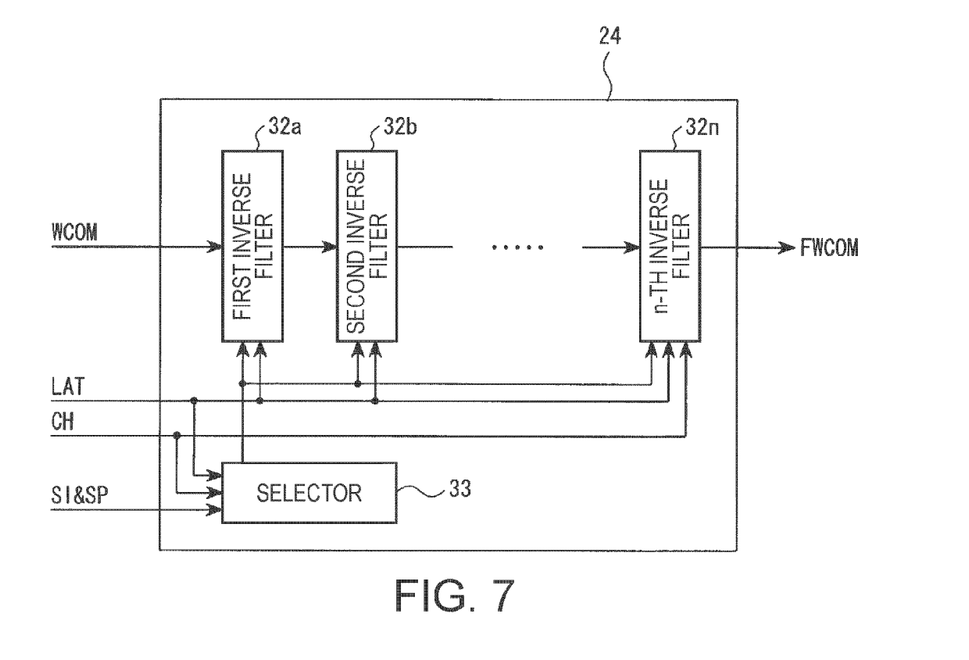
FIG. 7 is a block diagram illustrating an inverse filter circuit shown in FIG. 6.

As shown in FIG. 7, the inverse filter circuit 24 includes plural first to n-th stages of inverse filters 32a to 32n connected in series and is provided with a selector 33 for switching the selection switches disposed in the inverse filters 32a to 32n as described later.

The inverse filters 32a to 32n will be described in detail later.

Figure 8:
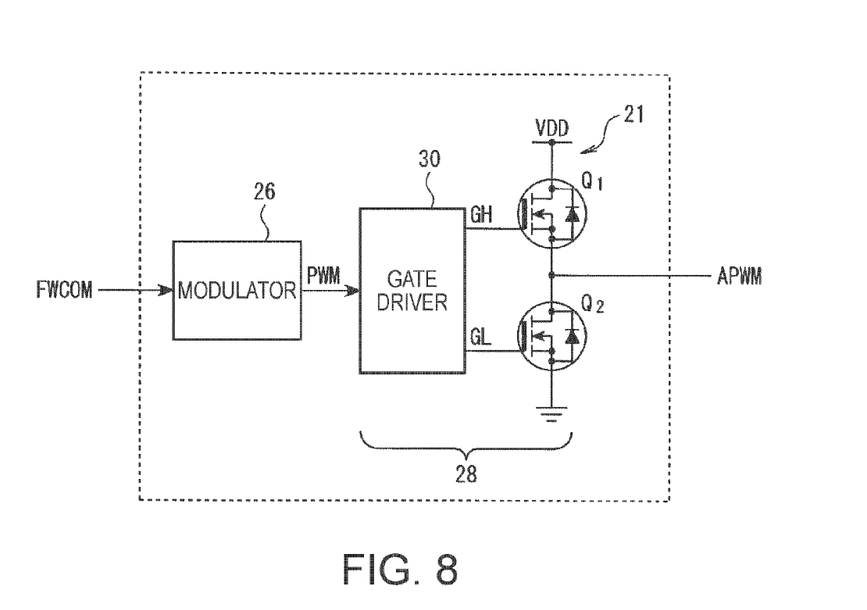
FIG. 8 is a block diagram illustrating a digital power amplifier shown in FIG. 6.

As shown in FIG. 8, a known pulse width modulation circuit is used as the modulator 26 pulse-modulating the inversely-filtered drive waveform signal FWCOM having been subjected to the inverse filtering process by the inverse filter circuit 24.

The pulse width modulation circuit compares a reference signal such as a triangular wave signal or a saw-toothed signal having a predetermined frequency with an input signal, that is, the inversely-filtered drive waveform signal FWCOM, and outputs a modulated signal with a pulse duty which is on-duty when the inversely-filtered drive waveform signal FWCOM is higher than the reference signal.

The frequency of the reference signal is defined as the modulation frequency (generally referred to as carrier frequency).

In addition, a well-known pulse modulation circuit such as a pulse density modulation (PDM) circuit can be used as the modulator 26.

The digital power amplifier 28 includes a half bridge output terminal 21 including a high-side switching element Q1 and a low-side switching element Q2 for substantially amplifying the power and a gate driver circuit 30 for adjusting gate-source signals GH and GL of the high-side switching element Q1 and the low-side switching element Q2 on the basis of the modulated signals from the modulator 26.

In the digital power amplifier 28, when the modulated signal is at a high level, the gate-source signal GH of the high-side switching element Q1 is at the high level and the gate-source signal GL of the low-side switching element Q2 is at a low level. Accordingly, the high-side switching element Q1 is switched to the ON state and the low-side switching element Q2 is switched to the OFF state. As a result, the output of the half bridge output terminal 21 is a supply voltage VDD.

On the other hand, when the modulated signal is at a low level, the gate-source signal GH of the high-side switching element Q1 is at the low level and the gate-source signal GL of the low-side switching element Q2 is at the high level. Accordingly, the high-side switching element Q1 is switched to the OFF state and the low-side switching element Q2 is switched to the ON state. As a result, the output of the half bridge output terminal 21 is 0.

In this way, when the high-side and low-side switching elements are driven in a digital manner, current flows in the switching element in the ON state, but the resistance value between the drain and the source is very small and thus power loss is hardly caused.

Since no current flows in the switching element in the OFF state, power loss is not caused.

Therefore, the power loss of the digital power amplifier 28 is very small and thus a small-sized switching element such as MOSFET can be used.

Figure 9:
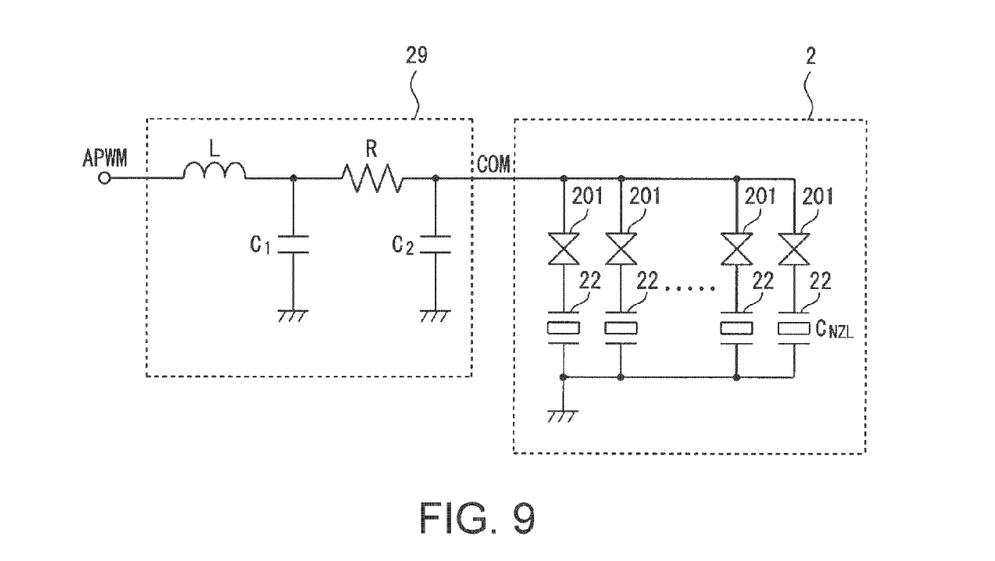
FIG. 9 is a block diagram illustrating a low pass shown in FIG. 6.

As shown in FIG. 9, a third-order filter including two capacitors C1 and C2, a coil L, and a resistor R is used as the low pass filter 29.

The modulation frequency, that is, the frequency component of the pulse modulation, generated from the modulator 26 is reduced and removed by the low pass filter 29 and the drive signal COM (drive pulses PCOM) having the above-mentioned waveform characteristic is output.

The piezoelectric device as the actuator 22 is a capacitive device and the individual actuators 22 have a predetermined electrostatic capacitance CNZL.

Since the actuators 22 driven to eject a liquid are connected to the drive circuit via the selection switches 201, the electrostatic capacitance of the equivalent second capacitor C2 varies depending on the number of driven actuators 22 in FIG. 9.

Specifically, the transfer function T(s) of the filter including the low pass filter 29 and the electrostatic capacitor CNZL of the driven actuators 22 is expressed by Expression (1).

$$T(s) = \frac{\frac{1}{LRC_1(C_2 + C_{NZL} \times N_{NZL})}}{s^3 + \frac{C_1 + (C_2 + C_{NZL} \times N_{NZL})}{RC_1(C_2 + C_{NZL} \times N_{NZL})}s^2 + \frac{1}{LC_1}s + \frac{1}{LRC_1(C_2 + C_{NZL} \times N_{NZL})}} \quad (1)$$

As can be clearly seen from Expression (1), the transfer function T(s), that is, the frequency characteristic, of the filter varies depending on the number NNZL of driven actuators 22.

Figure 10:
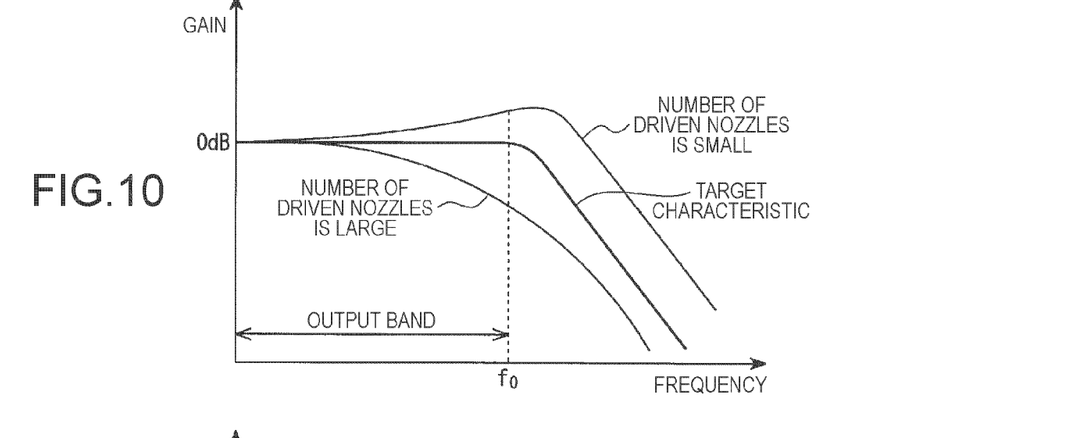
FIG. 10 is a diagram illustrating the frequency characteristic of a filter including the low pass filter and electrostatic capacitors of the actuators.

FIG. 10 shows an example of the frequency characteristic of the filter.

The target characteristic in the drawing represents the frequency characteristic of the low pass filter 29 set when a half of all the actuators 22 are driven and the gain in the entire output frequency band of the drive signal COM (drive pulses PCOM) is 0 dB.

That is, in the output frequency band, the amplified digital signal APWM is neither emphasized nor de-emphasized, but particularly the modulation frequency component is de-emphasized in a frequency band higher than the output frequency band.

Regarding the target characteristic, when the number of driven actuators 22 is great (the number of driven nozzles is great in the drawing), the characteristic of the high frequency de-emphasis filter varies and the cutoff frequency is shifted to a low frequency.

On the other hand, when the number of driven actuators 22 is small (the number of driven nozzles is small), the cutoff frequency is shifted to a high frequency and the characteristic has a peak.

Figure 11A:
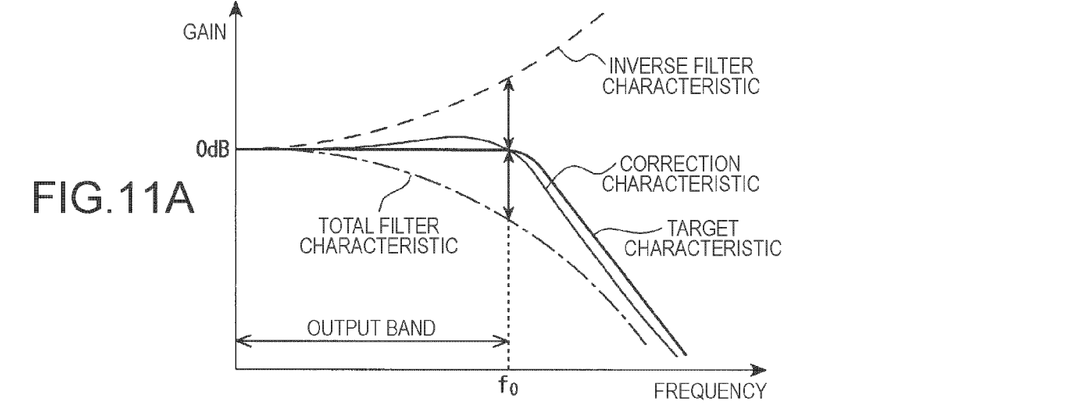
FIGS. 11A and 11B are diagrams illustrating the frequency characteristic varied by the first-stage inverse filter.

Regarding the frequency characteristic of the filter including the low pass filter 29 and the electrostatic capacitor of the driven actuators 22, a case is considered where a first-order high frequency emphasis filter is used as the inverse filter when the cutoff frequency is shifted to a low frequency. In this case, as shown in FIG. 11A, even when the gain in the highest frequency f0 of the output frequency band of the drive signal COM (drive pulses PCOM) is adjusted to be 0 dB, a peak appears in the gain characteristic due to the frequency characteristic of the inverse filter in a frequency band lower than the highest frequency, thereby not obtaining a desired frequency.

Figure 11B:
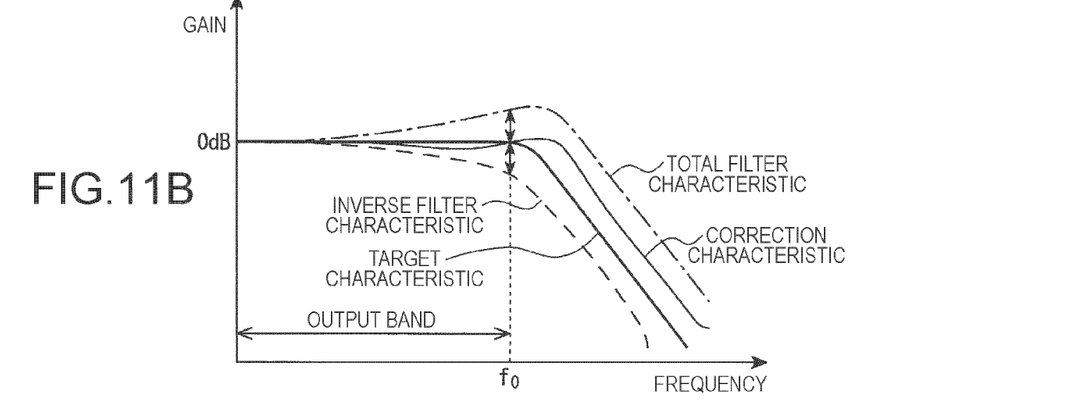

On the contrary, a case is considered where a first-order high frequency de-emphasis filter is used as the inverse filter when a peak appears in the frequency characteristic. In this case, as shown in FIG. 11B, even when the gain in the highest frequency f0 of the output frequency band of the drive signal COM (drive pulses PCOM) is adjusted to be 0 dB, the gain is lowered due to the frequency characteristic of the inverse filter in a frequency band lower than the highest frequency, thereby not obtaining a desired frequency.

When the desired frequency is not obtained, it is not possible to obtain the desired waveform precision of the drive signal COM (drive pulses PCOM).

Figure 12:
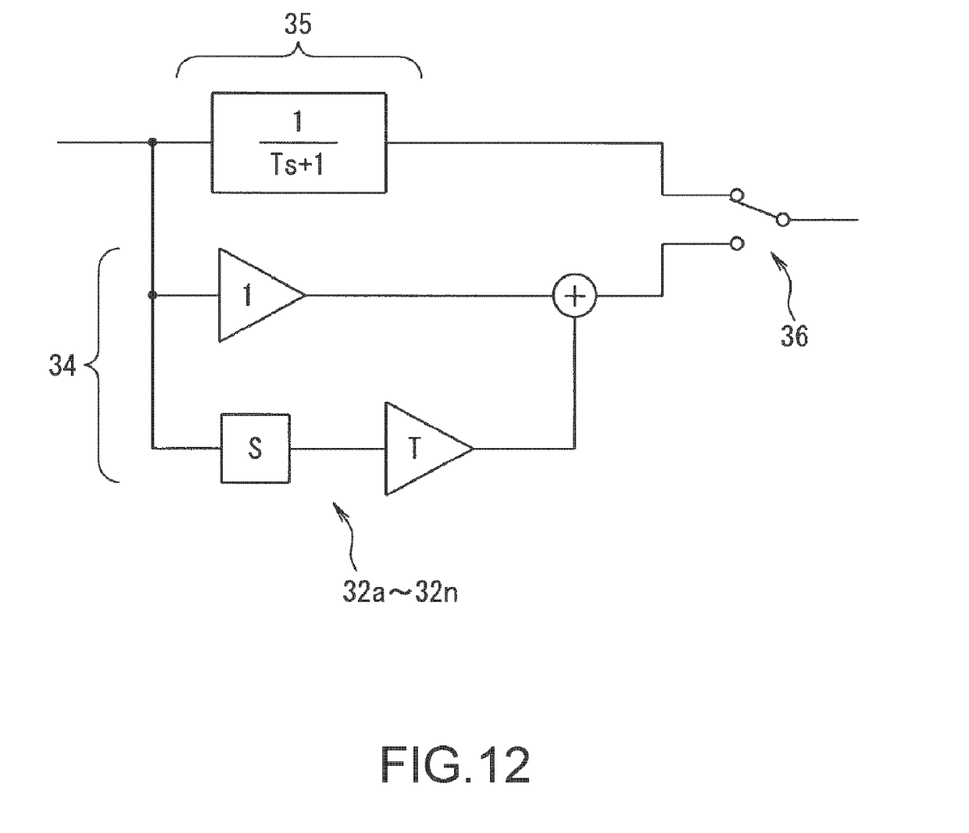
FIG. 12 is a block diagram illustrating the inverse filters shown in FIG. 7.

Therefore, in this embodiment, as shown in FIG. 12, a high frequency emphasis filter 34 and a high frequency de-emphasis filter 35 are arranged in parallel in each of the first to n-th inverse filters 32a to 32n, a selection switch 36 is disposed in both filters, and the selection switch 36 is switched by the use of the selector 33 to select one of the high frequency emphasis filter 34 and the high frequency de-emphasis filter 35.

Since the number of driven actuators 22 can be detected from the drive pulse selection data SI&SP, the selector 33 switches the selection switches 36 depending on the number of driven actuators 22.

The high frequency emphasis filter 34 and the high frequency de-emphasis filter 35 are so-called digital filters and are constructed by a computing process using a program. Therefore, the filter constants of the filters are variable.

The selection switches 36 are also substantially constructed by a computing process using a program.

Here, a method of setting a time constant T of the high frequency emphasis filter (first-order high-pass filter) in the inverse filters will be described.

The transfer functions G(s) and G(jω) and the gain "Gain" of the first-order high-pass filter are expressed by Expression (2).

$$G(s)=1+sT, G(j\omega)=1+j\omega T \quad (2)$$

$$Gain = 20\log_{10}\sqrt{1+(\omega T)^2}$$

As described later, the gain Gain of the first-order high-pass filter is set so that the gain in a predetermined set frequency fm (where m is a subscript) is a predetermined value, that is, 0 dB in this case, and the expression is solved to obtain the time constant Tm.

When it is assumed that the gain in the set frequency fm of the filter including the low pass filter 29 and the electrostatic capacitor CNZL of the actuators 22 is Gm and ωm=2πfm, the time constant T is calculated by Expression (3).

$$20\log_{10}\sqrt{1+(\omega m Tm)^2} + 20\log_{10}|Gm| = 0 \quad (3)$$

$$1+(\omega m Tm)^2 = \frac{1}{Gm^2}$$

$$\therefore Tm = \pm \frac{\sqrt{1-Gm^2}}{\omega m Gm}$$

Then, a method of setting a time constant T of the high frequency de-emphasis filter (first-order low-pass filter) in the inverse filters will be described.

The transfer functions G(s) and G(jω) and the gain "Gain" of the first-order low-pass filter are expressed by Expression (4).

$$G(s) = \frac{1}{1+sT},\quad (4)$$

$$G(j\omega) = \frac{1}{1+j\omega T}$$

$$Gain = 20\log_{10}\sqrt{\frac{1}{1+(\omega T)^2}}$$

In this case, the gain "Gain" of the first-order low-pass filter is set so that the gain in a predetermined set frequency fm (where m is a subscript) is a predetermined value, that is, 0 dB in this case, and the expression is solved to obtain the time constant T.

When it is assumed that the gain in the predetermined frequency fm of the filter including the low pass filter 29 and the electrostatic capacitor CNZL of the actuators 22 is Gm and ωm=2πfm, the time constant Tm is calculated by Expression (5).

$$20\log_{10}\sqrt{\frac{1}{1+(\omega m Tm)^2}} + 20\log_{10}|Gm| = 0 \quad (5)$$

$$1+(\omega m Tm)^2 = Gm^2$$

$$\therefore Tm = \pm \frac{\sqrt{Gm^2-1}}{\omega m}$$

A method of setting the filter constants of the inverse filters will be described now.

As described above, when the number of driven actuators 22 is determined for the target frequency characteristic of the filter (hereinafter, also referred to as total filter) including the low pass filter 29 and the electrostatic capacitor of the actuators 22, the actual frequency characteristic of the total filter is also determined.

Figure 13A:
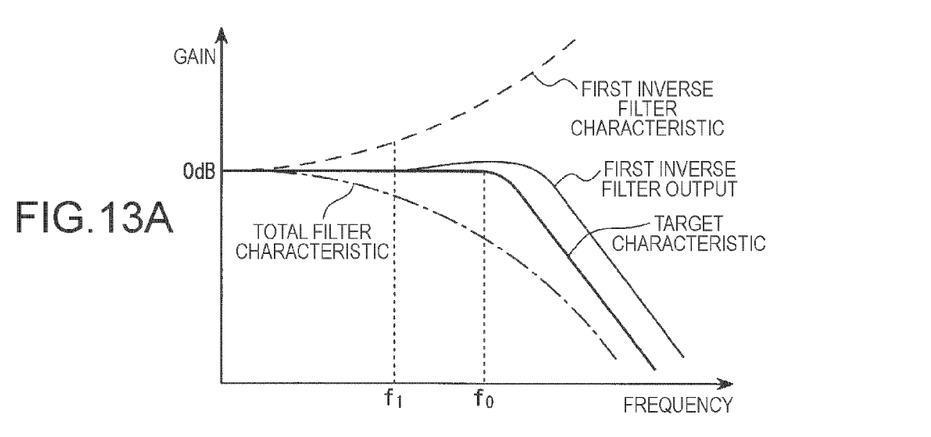
FIGS. 13A and 13B are diagrams illustrating the setting of the filter constants of the inverse filters.

Accordingly, as shown in FIG. 13A, when the cutoff frequency of the frequency characteristic (total filter characteristic in the drawing) of the total filter is shifted to a lower frequency than the target frequency characteristic (target characteristic in the drawing) and the highest frequency in the output frequency band of the drive signal COM (drive pulses PCOM) is f0, the frequency characteristic of the first inverse filter 32a, that is, the time constant T1 of the high frequency emphasis filter in this case, is set on the basis of Expression (3) so that the gain in the set frequency f1 lower than the highest frequency is 0.

Figure 13B:
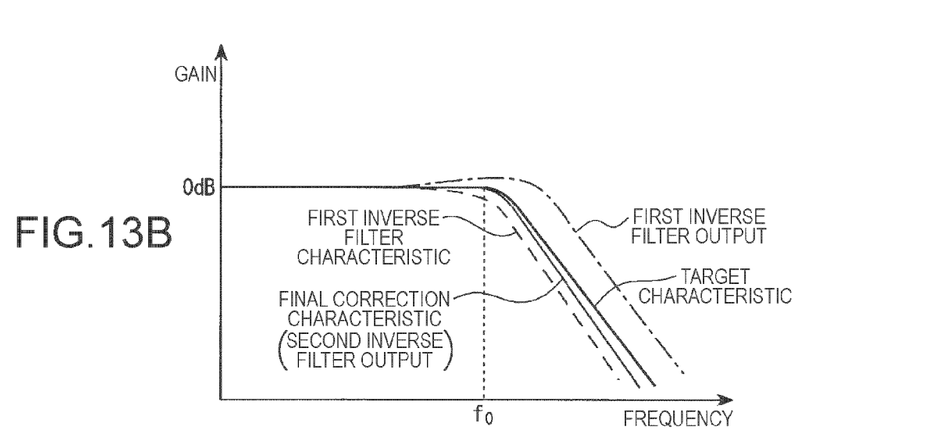

In this case, the output of the first inverse filter 32*a* (the first inverse filter output in the drawing) shown in FIG. 13B has a peak as described above. Accordingly, to bring the output of the first inverse filter 32*a* close to the target frequency characteristic, the frequency characteristic of the second inverse filter 32*b*, that is, the time constant T2 of the high frequency de-emphasis filter in this case, is set on the basis of Expression (5) so that the gain in the highest frequency f0 of the output frequency band of the drive signal COM (drive pulses PCOM) is 0.

Figure 14A:
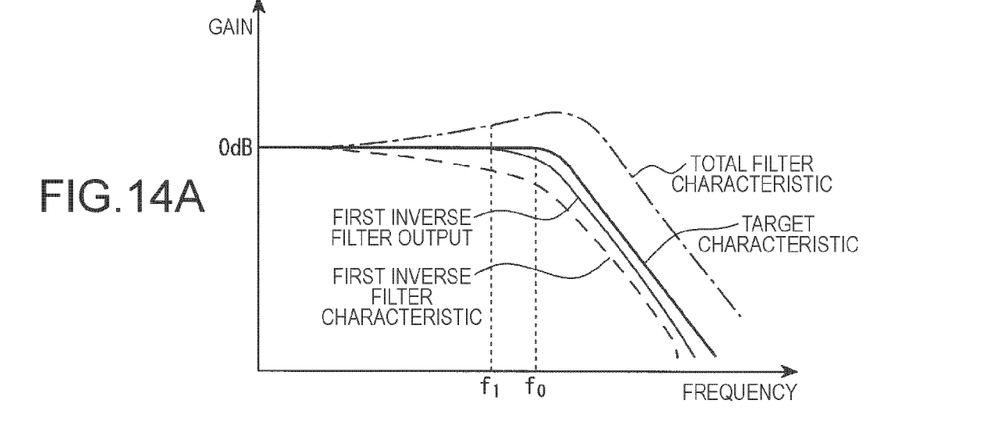
FIGS. 14A and 14B are diagrams illustrating the setting of the filter constants of the inverse filters.

On the other hand, as shown in FIG. 14A, when the cutoff frequency of the frequency characteristic (total filter characteristic in the drawing) of the total filter is shifted to a higher frequency than the target frequency characteristic (target characteristic in the drawing) and a peak occurs, the frequency characteristic of the first inverse filter 32*a*, that is, the time constant T1 of the high frequency de-emphasis filter in this case, is set on the basis of Expression (5) so that the gain in the set frequency f1 lower than the highest frequency f0 in the output frequency band of the drive signal COM (drive pulses PCOM) is 0.

Figure 14B:
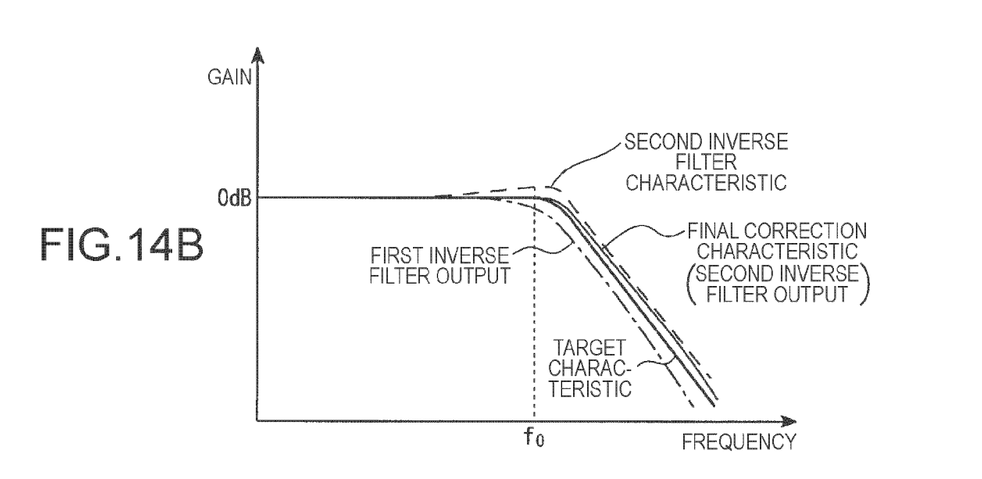

In this case, in the output of the first inverse filter 32*a* (the first inverse filter output in the drawing) shown in FIG. 14B, the cutoff frequency is shifted to a lower frequency than the target frequency characteristic as described above. Accordingly, to bring the output of the first inverse filter 32*a* close to the target frequency characteristic, the frequency characteristic of the second inverse filter 32*b*, that is, the time constant T2 of the high frequency emphasis filter in this case, is set on the basis of Expression (3) so that the gain in the highest frequency f0 of the output frequency band of the drive signal COM (drive pulses PCOM) is 0.

Figure 15:
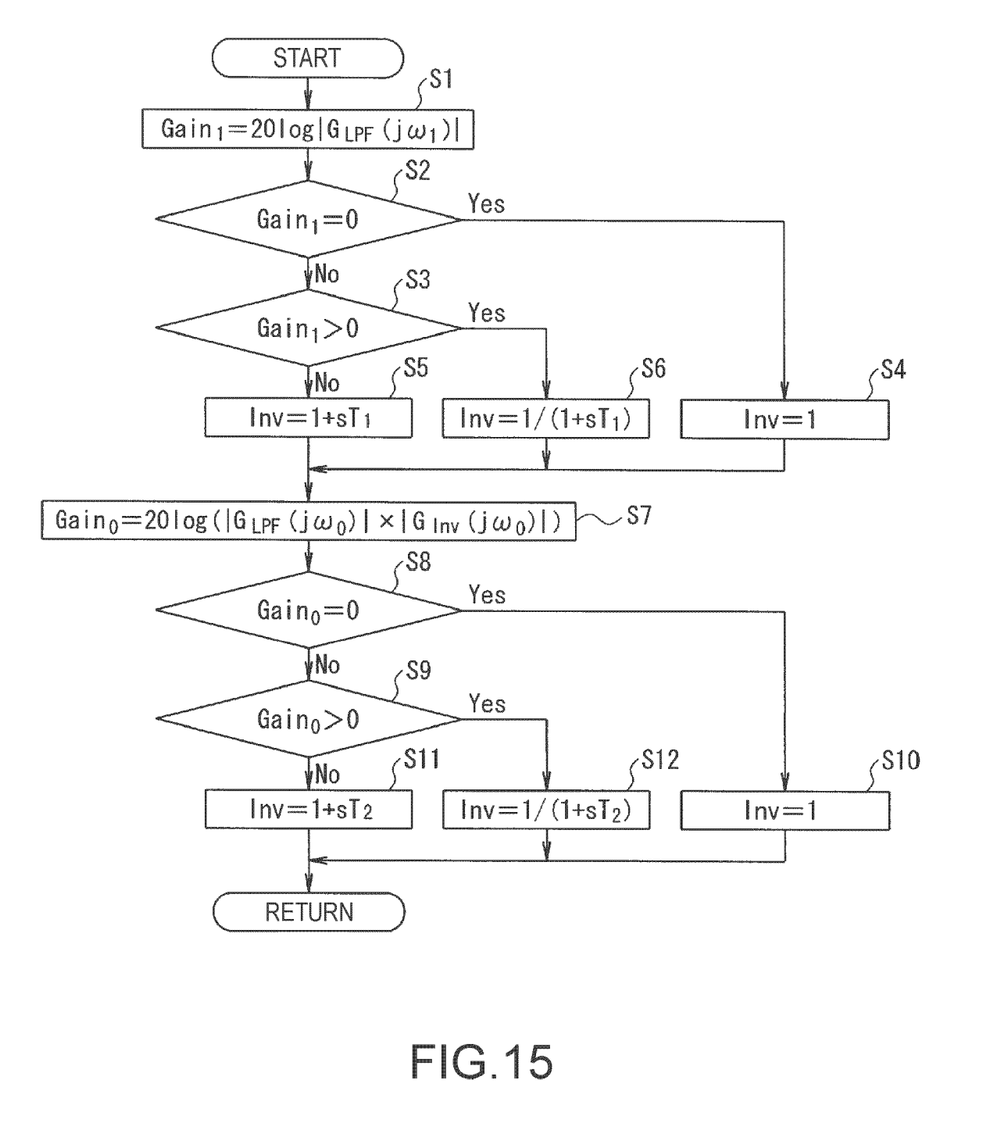
FIG. 15 is a flowchart illustrating the logics of setting the filter constants of the inverse filters.

FIG. 15 is a flowchart illustrating the above-mentioned logics of setting the filter characteristics of the inverse filters 32*a* to 32*n*.

However, the time constants T1 and T2 in the flowchart are independently set on the basis of Expression (3) or (5).

In the flowchart, in step S1, the gain Gain1 in the set frequency f1 lower than the highest frequency f0 in the output frequency band of the drive signal COM (drive pulses PCOM) is first calculated from the transfer function GLPF of the total filter.

Then, in step S2, it is determined whether the gain Gain1 in the set frequency f1 calculated in step S1 is 0. The process of step S4 is performed when it is determined that the gain Gain1 is 0, and the process of step S3 is performed otherwise.

In step S3, it is determined whether the gain Gain1 in the set frequency f1 calculated in step S1 is a correct value. The process of step S6 is performed when it is determined that the gain Gain1 is a correct value, and the process of step S5 is performed otherwise.

In step S5, the filter characteristic of the first inverse filter 32*a* is set to the high frequency emphasis filter with the time constant T1 and then the process of step S7 is performed.

In step S6, the filter characteristic of the first inverse filter 32*a* is set to the high frequency de-emphasis filter with the time constant T1 and then the process of step S7 is performed.

In step S4, the filter characteristic of the first inverse filter 32*a* is set to a through-state and then the process of step S7 is performed.

In step S7, the gain Gain0 in the highest frequency f0 of the output frequency band of the drive signal COM (drive pulses PCOM) is calculated from the transfer function GLPF of the total filter and the set transfer function GInv of the first inverse filter.

In step S8, it is determined whether the gain Gain0 in the set frequency f0 calculated in step S7 is 0. The process of step S10 is performed when it is determined that the gain Gain0 is 0, and the process of step S9 is performed otherwise.

In step S9, it is determined whether the gain Gain0 in the set frequency f0 calculated in step S7 is a correct value. The process of step S12 is performed when the gain Gain0 is a correct value, and the process of step S11 is performed otherwise.

In step S11, the filter characteristic of the second inverse filter 32*b* is set to the high frequency emphasis filter with the time constant T2 and then the flow of processes is returned to the main program.

In step S12, the filter characteristic of the second inverse filter 32*b* is set to the high frequency de-emphasis filter with the time constant T2 and then the flow of processes is returned to the main program.

In step S4, the filter characteristic of the second inverse filter 32*b* is set to a through-state and then the flow of processes is returned to the main program.

In this way, by setting the filter characteristics of the plural inverse filters 32*a* to 32*n* depending on the number of driven actuators 22 and allowing the selector 33 to calculate the number of driven actuators 22 from the drive pulse selection data SI&SP and to operate the inverse filters 32*a* to 32*n* corresponding to the number, it is possible to obtain the desired waveform precision of the drive signal COM (drive pulses PCOM) for all the driven actuators 22.

As described above, in the power amplifier according to this embodiment, the drive waveform signal WCOM serving as a reference of the drive signal COM (drive pulses PCOM) of the actuators 22 is pulse-modulated by the use of the modulator 26, the power of the pulse-modulated signal is amplified by the digital power amplifier 28, the amplified digital signal APWM is smoothed by the use of the low pass filter 29 and is supplied as the drive signal to the actuators 22. Here, the inverse filter circuit 24 including plural inverse filters 32*a* to 32*n* connected in series is disposed at the front stage of the modulator 26 and the filter constants of the inverse filters 32*a* to 32*n* can be individually set. Even when the frequency characteristic of the total filter including the low pass filter 29 and the electrostatic capacitor of the actuators 22 varies depending on the number of driven actuators 22, it is possible to obtain the desired waveform precision of the drive signal COM (drive pulses PCOM) by combinations of the filter constants and thus to simplify the configuration by using low-order filters as the inverse filters 32*a* to 32*n*.

In each of the inverse filters 32*a* to 32*n*, by selecting one of the high frequency emphasis filter 34 and the high frequency de-emphasis filter 35 depending on the number of driven actuators 22 by the use of the selection switch 36, it is possible to cope with the case where the number of driven actuators 22 increases and decreases and thus to obtain the desired waveform precision of the drive signal COM (drive pulses PCOM).

By using the first-order filters as the high frequency emphasis filter 34 and the high frequency de-emphasis filter 35, it is possible to simplify the configuration.

Since the filter constants of the inverse filters 32*a* to 32*n* can be independently set, it is possible to obtain a higher-precision waveform.

Since the inverse filters 32*a* to 32*n* are set so that the output gain in the set frequency is 0 dB, it is possible to guarantee the desired waveform precision of the drive signal COM (drive pulses PCOM).

By setting the set frequency of the final-stage inverse filter 32*n* to the highest frequency f0 in the frequency band of the drive signal COM (drive pulses PCOM), it is possible to guarantee the waveform precision of the drive signal COM (drive pulses PCOM).

By setting the set frequency of a later-stage inverse filter to be higher, it is possible to easily set the filter constants of the inverse filters and to guarantee the waveform precision of the drive signal COM (drive pulses PCOM).

In the above-mentioned embodiment, the power amplifier is used in the line-head liquid jet printing apparatus. However, the power amplifier according to the embodiment of the invention may be used in a multi-pass liquid jet printing apparatus.

The liquid jet printing apparatus employing the power amplifier according to the invention may be embodied as a liquid jet printing apparatus ejecting liquids other than ink (including liquid materials in which functional material particles are dispersed and fluid materials such as gel in addition to the liquid) or fluids other than the liquids (such as solid materials which can be ejected as fluid).

Examples of the liquid ejecting apparatus includes a liquid material ejecting apparatus ejecting liquid materials in which electrode materials or coloring materials used to manufacture a liquid crystal display, an EL (Electroluminescent) display, a surface emission display, a color filter, and the like are dispersed or dissolved, a liquid ejecting apparatus ejecting biological organics used to manufacture a biological chip, and a liquid ejecting apparatus ejecting a liquid as a sample and being used as a precision pipette.

The examples of the liquid ejecting apparatus may include a liquid ejecting apparatus ejecting lubricant to a precision machine such as a watch or a camera by the use of a pin point, a liquid ejecting apparatus ejecting onto a substrate a transparent resin liquid such as UV-curable resin to form micro semi-spherical lenses (optical lenses) used in optical communication devices, a liquid ejecting apparatus ejecting etchant such as acid or alkali to etch a substrate or the like, a fluid material ejecting apparatus ejecting gel, and a fluid-ejecting recording apparatus ejecting solid powder materials such as toner.

The invention can be applied to any of the above-mentioned ejecting apparatuses.

What is claimed is:

1. A power amplifier comprising:
    an inverse filtering unit that receives a drive waveform signal and a signal indicative of expected load of actuators to output an inverse filtered signal;
    a modulator that pulse-modulates the inverse filtered signal to output a modulated signal;
    a digital power amplifier that amplifies the modulated signal to output an amplified digital signal; and
    a low pass filter that filters the amplified digital signal to output the drive signal, wherein
    the inverse filtering unit includes a plurality of inverse filters connected in series.

2. The power amplifier according to claim 1, wherein the inverse filters include a high frequency emphasis filter, a high frequency de-emphasis filter, and a selector that selects either the high frequency emphasis filter or the high frequency de-emphasis filter.

3. The power amplifier according to claim 2, wherein the high frequency emphasis filter and the high frequency de-emphasis filter are first-order filters.

4. The power amplifier according to claim 1, wherein a filter constant of the inverse filters is independently configurable.

5. The power amplifier according to claim 4, wherein the inverse filters are configured to provide 0 dB of gain at a set frequency.

6. The power amplifier according to claim 5, wherein the set frequency of the inverse filter at the farthest downstream is the highest in the frequency band of the drive signal.

7. The power amplifier according to claim 5, wherein the set frequency for one of the inverse filters is set lower than that of the other inverse filters disposed on the downstream.

8. A liquid jet printing apparatus employing the power amplifier according to claim 1.

* * * * *